United States Patent
Elizur et al.

(10) Patent No.: US 6,743,556 B2
(45) Date of Patent: Jun. 1, 2004

(54) METHOD FOR ACCURATE PLACEMENT OF FLUID MATERIALS ON A SUBSTRATE

(75) Inventors: Eran Elizur, Vancouver (CA); Andrew Lau, Richmond (CA)

(73) Assignee: Creo SRL, Burnaby (CA)

( * ) Notice: Subject to any disclaimer, the term of this patent is extended or adjusted under 35 U.S.C. 154(b) by 350 days.

(21) Appl. No.: 09/924,518

(22) Filed: Aug. 9, 2001

(65) Prior Publication Data

US 2003/0031942 A1 Feb. 13, 2003

(51) Int. Cl.[7] .............................. B41J 3/00; G02B 5/20
(52) U.S. Cl. ............................ 430/7; 430/200; 347/2; 347/4; 347/262; 347/264
(58) Field of Search .......................... 430/7, 200, 201, 430/321; 347/2, 4, 106, 107, 224, 225, 262, 264

(56) References Cited

U.S. PATENT DOCUMENTS 5,521,035 A * 5/1996 Wolk et al. ................... 430/20
5,817,441 A    10/1998 Iwata et al.
5,908,721 A    6/1999 Emoto et al.
5,948,577 A    9/1999 Nakazawa et al.
6,022,647 A    2/2000 Hirose et al.
6,042,974 A *  3/2000 Iwata et al. ..................... 430/7

FOREIGN PATENT DOCUMENTS

JP    6-347637 A2    12/1994
JP    10-197715 A2    7/1998

* cited by examiner

*Primary Examiner*—John A McPherson
(74) *Attorney, Agent, or Firm*—Oyen Wiggs Green & Mutala

(57) ABSTRACT

A method and apparatus for forming a partition layer on a substrate by imaging a thermal or laser transfer medium onto the substrate using a imagewise controlled radiation source. A matrix of partition cells are created on the substrate that can, in a further step, be selectively filled with fluid or ink using an inkjet printing technique. The partition layer, the substrate, and fluids to be deposited are selected so that the fluids wet the substrate but not the partitions, preventing bending between adjacent cells.

71 Claims, 1 Drawing Sheet

METHOD FOR ACCURATE PLACEMENT OF FLUID MATERIALS ON A SUBSTRATE

FIELD OF THE INVENTION

The present invention pertains to processes involving the deposition of one or more fluid materials onto a substrate.

BACKGROUND OF THE INVENTION

There are many industrial processes where accurate or controlled deposition of fluid substances is desirable. While this is true for the printing industry, especially with respect to inkjet printing, it also applies to other manufacturing processes, particularly in the electronics and microelectronics industry. Examples include processes involved in the manufacture of display screens and other electronic components.

Recent advances in inkjet printing technologies have vastly improved inkjet printing as a means for the precise deposition of liquid droplets. Because inkjet printing makes it possible to deposit very small measures of fluid very accurately and cheaply, and because inkjet deposition typically requires fewer steps and less equipment than conventional methods such as photolithography, it is a very attractive candidate for many precision-manufacturing applications outside of conventional printing. Outside of the graphic arts, examples of proposed applications of inkjet printing include manufacture of color filters for flat panel displays, manufacture of OLED devices, deposition of microlenses on the tips of optical fibers, deposition of conductive ink in the manufacture of circuit boards, and the manufacture of 3-dimensional objects.

In many of the proposed applications, the precise placement of the fluid substance, whether ink or polymer or other material, is critical. In the case of color filter manufacture for conventional flat panel displays or OLED devices, many such precisely placed fluid droplets must be placed very close to other such droplets without coalescing. This is particularly important in situations in which different kinds of fluids are being deposited on the same substrate, such as differently colored inks on a color filter substrate. In the case of color filters, it is vital to the quality of the filter to prevent blending between discrete ink droplets, as differently colored filter elements are typically situated adjacent to one another on a clear substrate, separated only by a minute barrier on the order of some microns across. In the case of organic light emitting diodes (OLED) and semiconducting polymers, the actual active device materials also need to be deposited with great accuracy and circumspection in order to ensure that the various sections of the devices remain well delineated.

The use of fluid droplet deposition techniques, for precision manufacturing applications does, however, present a number of difficulties. Firstly, inkjet technology typically has a spatial accuracy of approximately 40 microns while the display screen and semiconductor industries require accuracies at least an order of magnitude better. Secondly, there are particular problems with respect to controlling the position of the fluids once they have been deposited upon a substrate.

For example, in the case where the fluid material is intended to adhere to the substrate, problems arise because the ability of the fluid to adhere to a surface is related to its ability to wet a surface, and the fact that a fluid capable of wetting a surface will also tend to spread upon that same surface. This can cause undesirable effects such as coalescence of adjacent droplets as well as blending of the fluids in adjacent droplets. Droplet spreading can also lead a non-uniform thickness of the layer on the substrate, as the fluid droplet layer may tend to be thinner at its boundaries when it spreads.

In applications where it is necessary to deposit a pattern of one or more fluid substances that need to be contained within specific areas, the wetting of the substrate will prevent accurate and uniform placement of droplets, as well as non-uniform thicknesses in layers created with the fluid droplets. At the same time, the droplets are generally required to adhere well to the substrate upon which they are deposited.

One area in which the specific aforementioned problem can be an issue is the manufacture of color filters for flat panel displays. Manufacturers are faced with a stringent requirement for the accurate placement of fluid substances without being able to tolerate any coalescence or blending between fluid droplets from adjacent patterned cells. Filter layer thickness and the distribution of colorant in the layer are also important to ensure that each colored region transmits light uniformly.

The color filter of a liquid crystal display is typically fabricated with alternating cells of red, green, and blue material deposited on a transparent substrate at the same matrix spacing as the panel. The colored materials act as filters and therefore transmit light. To enhance contrast, a light-shielding region, known as a black matrix, usually demarcates the color cells. This black matrix typically has an optical density of greater than 3.0 in order to adequately block stray light from adjacent cells. It is also used to mask non-emitting areas such as LCD cell electrodes.

Many different methods have been used or proposed for forming the partition walls. Typically, photolithography is used. However, other methods such as electrodeposition, screen offset printing, gravure printing, flexographic printing, and inkjet printing have also been suggested in the art.

Most of these methods suffer from a number of deficiencies. In general the very precise methods are expensive and complicated, and often require additional processing steps or expensive equipment. The printing based methods tend to be cheaper, but tend to suffer the fact that the partitions are being made by applying a liquid to a surface, with the same attendant problems of liquid spreading and coalescence. Conventional manufacturing techniques like photolithography are costly due to the need for complex processes like vacuum chamber deposition as well as the multiple steps which are required to produce a finished color filter. On the other hand, currently available alternative methods are either just as complex, or lack the required precision. The resulting high fabrication costs have thus prevented flat panel displays from replacing conventional CRT displays in applications where cost is a primary concern. This has happened despite their many desirable characteristics, such as compact size and low radiation emissions.

Other types of display devices, based on OLEDs, have requirements slightly different from conventional color filters. For example, because OLEDs are light emitting, the optical density required for the partition walls may not be as severe and hence controlling the thickness of the fluid layers may be less important. However, accurate placement is still needed. For example, an OLED display may be made up of OLED cells of different colours, which again would require that closely placed fluid droplets be prevented from mixing or coalescing.

A number of methods of addressing this problem have been proposed, and the concept of using the surface energy characteristics of the fluids, substrates, and the partition barriers to control the placement of inkjetted droplets has specifically been suggested. Again, as with previously mentioned approaches to fabricating partition walls in general, the various approaches proposed for producing a desirable pattern of surface energy variations on a substrate of a colour filter have tended to be either expensive or complex. Additionally, they frequently require many processing steps, including post-processing steps, or lack the precision required for the manufacture of devices such as color filters for flat panel displays or OLED displays.

The incorporation of conventional printing techniques has been proposed in various approaches, since the conventional printing industry has extensive experience with methods to produce large numbers of precisely patterned objects at low cost. However, the use of conventional printing techniques requiring the use of liquid ink to produce precisely patterned surface energy variations on a substrate suffers the same problems mentioned earlier with regard to adhesion, wettability, and liquid spreading.

One well-known printing technique that does not involve the deposition of a fluid in order to create a precise pattern on a surface is thermal transfer. This technology is employed extensively in the printing and imaging field for the purposes of proofing. In applying this technology to the filter, OLED and polymeric semiconductor devices addressed here, it has the benefit of not employing liquids that could spread or coalesce.

In thermal transfer, a donor material layer is disposed on a carrier sheet. This medium is then either placed in close proximity with a substrate or in contact with that substrate, such that the donor layer faces the substrate. The donor layer is then transferred from the carrier sheet to the required areas of the substrate by a variety of means. These include illumination with a laser or another thermal source. When a laser is employed in this fashion, the process is referred to as laser induced film transfer.

The mechanism of transfer varies from essentially explosive heating of the interlayer between the donor and carrier to detach a minute amount of donor material, to phase change processes. When a phase change is employed, the process is known as phase change transfer. All the mechanisms have the net result of transferring donor material in a precisely defined fashion from the carrier sheet to the substrate on which the image or pattern is required. Provided a well-defined laser-beam is used, images or patterns may be imagewise written onto the carrier to transfer the donor material imagewise to the substrate. This technology provides a method to obtain very well-defined edge structures and is inherently capable of the precision required for the devices discussed here.

Unfortunately, there has to date been no simple method proposed for incorporating thermal transfer into an inkjet-based method for manufacturing colour filters, OLED devices or semiconducting polymer devices.

SUMMARY OF THE INVENTION

A method for forming a partition layer on a substrate by imaging a thermal or laser transfer medium onto the substrate using a imagewise controlled radiation source is described. A matrix of partition cells is created on the substrate that can, in a further step, be selectively filled with fluid. The selective filling of partition cells can be accomplished using an inkjet printing technique. The partition layer, the substrate, and fluids to be deposited are selected so that the fluids wet the substrate but not the partitions, preventing unwanted interactions between fluids in adjacent cells. An apparatus for implementing this method is also described.

DESCRIPTION OF THE PREFERRED EMBODIMENT

Figure 1A:
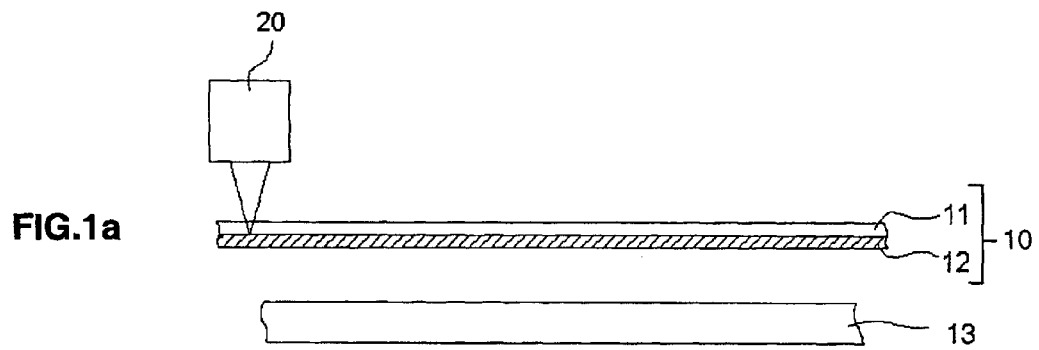
FIGS. 1a–1d show the process steps of the present invention.
Figure 1B:
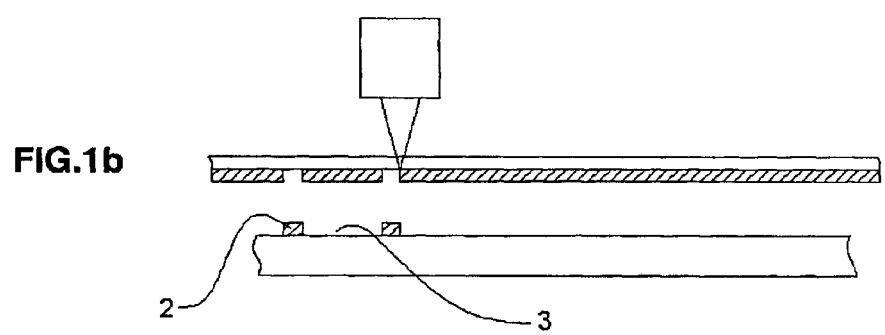
Figure 1C:
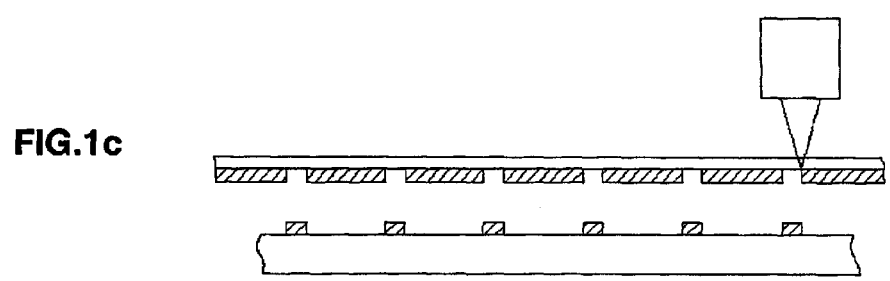
Figure 1D:
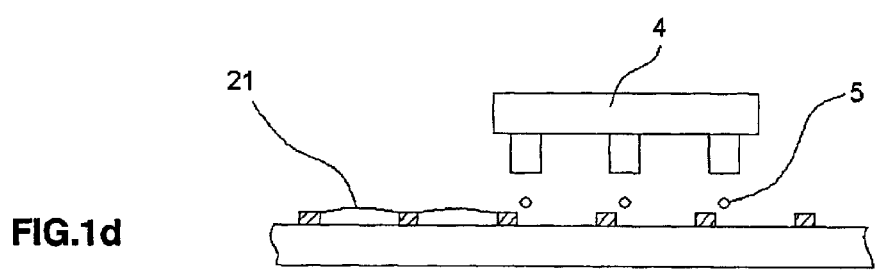

FIG. 1-a through 1-d show cross sectional views of the process for forming partition barriers on a substrate according to the preferred embodiment of the present invention. It is to be understood that the present invention is executed in at least two dimensions to create a two-dimensional pattern to be used to control the placement of fluids. In general the material being deposited may have any desired surface energy to affect the subsequent placement of liquid droplets on the surface on which the material is deposited. In a preferred embodiment of the present invention, the invention is described using the example of a low surface energy material that is transferred to a surface.

In FIG. 1-a a carrier layer 11 and a low surface energy partition material layer 12 initially adhering to carrier layer 11, is positioned above a substrate 13. In the preferred embodiment of the present invention the transfer media fixture (not shown) serves to maintain donor sheet 10 in position above substrate 13.

In an alternative embodiment of the present invention, the use of phase change media requires that donor sheet 10 be maintained in contact with substrate 13.

Substrate 13 can be glass, chromium, or any other material to which the low surface energy partition material of layer 12 will adhere. Substrate 13 is mounted on a stage (not shown) that may be fixed or movable in one or more dimensions. Imagewise controllable radiation source 20 is attached to a translation stage (not shown) that can be translated over the area of the substrate. By way of example, the translation stage may be similar to those employed in flatbed printers.

In an alternative embodiment of the present invention the imagewise controllable radiation source is affixed to a non-translating fixture.

In yet a further embodiment of the present invention, transfer of the low surface energy partition material of layer 12 is performed not via laser or on a point-by-point basis, but rather by using area illumination through a mask that has been provided with the pattern desired.

Returning to the preferred embodiment of the present invention, the radiation from imagewise controllable radiation source 20 is modulated in response to a data source (not shown) that determines the partition pattern to be formed. In a preferred embodiment of the present invention the radiation source 20 comprises one or more lasers and the lasers are switched on and off in response to the data source. The depth of modulation and functional form of the modulation may be adapted to suit the particular low surface energy partition material being used. On exposure to the radiation from imagewise controllable radiation source 20, the low surface energy partition material of layer 12 is transferred to substrate 13 in the areas where the radiation impinges on donor sheet 10.

In selecting materials for the substrate 13, partition material 12 and the fluid to be deposited as part of the preferred embodiment of the present invention, careful attention is paid to the relative surface energy of the materials as this determines the degree to which the fluid will wet the substrate 13 and the partition material 12. The surface energy of substrate 13 is chosen to be greater than the surface energy of the fluid to be deposited on it, which should in turn be greater than the surface energy of the material of low surface energy partition material layer 12. Under these conditions, the fluid adheres to the substrate 13 but does not spread past the partition layers.

An example of a thermal transfer medium that demonstrates properties suitable for application in the preferred embodiment of the present invention, is available from Imation Corp of Oakdale Minn., and is sold under the trade name Imation Matchprint™ Digital Halftone Proofing System. The Imation Matchprint medium works through a laser induced thermal film transfer. The laser transfers the pigment as a film from the donor sheet 10 to substrate 13 resulting in clean edges.

Another example of a similar medium is Dupont WaterProof®, available from Dupont Company of Wilmington, Del. This medium works slightly differently in that the donor sheet 10 and substrate 13 are in closer contact and the laser effects a phase change transfer, melting the low surface energy partition material layer 12, which then sticks to the receiver layer.

Other transfer media are available which operate through a laser ablation transfer where the donor undergoes an explosive decomposition and propulsion from donor to receiver. These commercially available media are primarily targeted at the color proofing market for the printing industry. Typically proofing media are available in a multitude of colors and a number of different formulations to suit various imaging devices. These media, with little customisation, can be used in forming partition layers on a substrate for applications that require accurate placement of fluids. In order to form good partition layers, the partition material is not wettable by the fluid to be contained in the partition. At present, inks used in color filter production typically have a surface tension of the order of 29 mN/meter and typically include butyl carbitol acetate as solvent. The partition material should also be chemically stable in the presence of the solvent. Furthermore, the medium has sufficient exposure sensitivity to allow it to be imaged using conventional imaging methods.

A suitable imagewise controllable radiation source for exposing the transfer media and creating the partitions is the SQUAREspot™ thermal imaging head, produced by CreoScitex of Burnaby, British Columbia, Canada. The SQUAREspot™ thermal imaging head is used in many areas of graphic arts imaging including digital proofing and is capable of imaging at a resolution up to 5080 dots per inch, with 20W of available imaging power divided into more than 200 independent channels. The radiation source is a laser diode bar with a wavelength of 830 nm. This imaging head is particularly suited to imaging features with very clean edges due to the substantially square profile of the laser beams it produces. Advantageously the SQUAREspot™ thermal imaging head is available with a beam size appropriate for writing the partitions, The CreoScitex imaging system is available with a 5 um spot size that is well suited to form these thin partitions.

In the present application for letters patent the term "imagewise controllable radiation source" is used to describe any radiation source that is imagewise controllable and which controllably emits radiation capable of transferring a medium imagewise from a carrier sheet to a substrate.

Referring now to FIG. 1-*b*, the imaging is partially completed and partition walls 2 have been deposited forming a cell 3 on the substrate 13. FIG. 1-*c* shows the imaging completed. At this stage a 2-dimensional grid partition pattern will have been formed.

Referring now to FIG. 1-*d*, on completion of imaging, the donor sheet is removed and the substrate 13 is ready to have fluid droplets 5 deposited into the cells forming areas of fluid 21. Fluid 21 may comprise a colorant such as a pigment or dye, or may be another type of fluid such as the active materials employed in making an organic light emitting diode (OLED) or a liquid semiconducting polymer. In the present application for letters patent, the term active materials is used to describe materials that play an active role in the functioning of an optoelectronic or electronic device. The roles include, but are not limited to, the formation of the p-n junction of a diode, the emission of light upon stimulation and the creation of free electrons in response to the absorption of photons. It is also clear that a plurality of different fluids may be deposited in droplet form in the same cell to create more complex structures or mixtures for electronic devices.

In the present application for letters patent the term electronic device is used to describe all devices of which the operation is based on the manipulation or behaviour of electrons, including specifically, but not limited to, those that absorb or emit light. This in particular includes all diodes, including specifically light emitting devices, and any optical filters, such as those employed by liquid crystal displays or organic light emitting devices (OLED).

In the preferred embodiment of the present invention a translation stage typical of commercial flatbed plotters is used to allow the imaging head to move in one axis whereas the substrate moves on an orthogonal axis, thus allowing the entire surface to be traversed. In addition, in the preferred embodiment of the present invention, an integrated imaging unit is used, such that the imagewise controllable radiation source 20 and fluid deposition unit 4 share the same translation stage. This combination allows the step of imagewise transferring the partition medium and the step of depositing fluid to be performed in succession on the same platform. In the preferred embodiment of the present invention, fluid deposition unit 4 is an inkjet head.

In an alternative embodiment, the imaging arrangement may consist of separate translation stages. It is clear to those skilled in the art that different arrangements may be employed to achieve the relative translation of the substrate and imagewise controllable radiation source 20. Similarly, a variety of arrangements to obtain the relative translation of substrate 13 and fluid deposition unit 4 are known in the art.

A particular alternative embodiment employs a flexible substrate mounted on a cylinder or drum. The cylinder rotates while the imagewise controllable radiation source traverses across the length of the cylinder. The motion of the imagewise controllable radiation source may be continuous, such that it writes a spiral swath around the cylinder, or it may be stepped, such that it writes circular swaths. These mechanical arrangements are well-established in the printing industry and will not be discussed in further detail here. The same arrangement may be applied to fluid deposition unit 4. Fluid deposition unit 4 and imagewise controllable radiation source 20 may also be mounted on the same stage.

In an alternative embodiment of the present invention, the fluid is deposited by a process other than ink-jetting. By way of example, the fluid may be deposited by a syringing method. In yet another example the fluid may be deposited by passing the substrate containing the partition cells through a bath of the fluid.

It should be understood that the above descriptions of the simple and preferred embodiments are intended for illustrative purposes only, and are not intended to limit the scope of the present invention in any way. Those skilled in the art will appreciate that various modifications can be made to the embodiments discussed above without departing from the spirit of the present invention.

What is claimed is:

1. A method for making an electronic device on a substrate, said method comprising the steps of
    a) providing a transfer medium, said transfer medium comprising:
        i) a carrier layer;
        ii) a low surface energy partition material layer;
    b) providing an imagewise controllable radiation source and
    c) transferring said partition material layer onto said substrate by imagewise exposing said transfer medium with said imagewise controllable radiation source.

2. A method as in claim 1, comprising the additional step of depositing an active material on those areas of said substrate bounded by said partition material.

3. A method as in claim 2, wherein said active material is a constituent material of an organic light emitting diode.

4. A method as in claim 2, wherein said active material is a constituent material of a semiconducting polymer device.

5. A method as in claim 2, wherein said depositing step is performed by inkjet.

6. A method as in claim 1, comprising the additional step of depositing a colorant material on those areas of said substrate bounded by said partition material.

7. A method as in claim 6, wherein said depositing step is performed by inkjet.

8. A method as in claim 1, wherein said imagewise controllable radiation source comprises a laser.

9. A method for forming a patterned partition layer on a substrate comprising the steps of:
    a) providing a transfer medium, said transfer medium comprising:
        i) a carrier layer;
        ii) a low surface energy partition material layer;
    b) providing an imagewise controllable radiation source;
    c) transferring said partition material layer onto said substrate by imagewise exposing said transfer medium using said imagewise controllable radiation source.

10. A method for rendering on a substrate a plurality of partition cells for a fluid from an inkjet device, said method comprising the steps of:
    a) providing an imagewise controllable radiation source;
    b) disposing between said imagewise controllable radiation source and said substrate a transfer medium containing low surface energy partition material and
    c) imagewise transferring said partition material from said transfer medium to said substrate by imagewise exposing said transfer medium using said imagewise controllable radiation source.

11. The method of claim 10 wherein said fluid comprises a colorant.

12. The method of claim 11 wherein said colorant is one of a pigment and a dye.

13. The method of claim 10 wherein said fluid comprises a solvent.

14. The method of claim 10 wherein said fluid comprises butyl carbitol acetate.

15. The method of claim 10 wherein said fluid is a semiconductor polymer.

16. The method of claim 10 wherein said fluid is a light emitting organic material.

17. The method of claim 10 wherein said imagewise controllable radiation source comprises a laser.

18. The method of claim 10 wherein said imagewise controllable radiation source comprises an infrared laser.

19. The method of claim 10 wherein said imagewise controllable radiation source comprises a laser based imaging head.

20. The method of claim 10 wherein said transfer medium operates through laser induced film transfer.

21. The method of claim 10 wherein said transfer medium operates through phase change transfer.

22. The method of claim 10 wherein said partition material is chemically stable in the presence of said fluid from said inkjet device.

23. The method of claim 10 wherein said partition material is opaque.

24. The method of claim 10 wherein said partition material is transparent.

25. The method of claim 10, wherein said substrate is flexible.

26. A method for fabricating a color filter matrix comprising the steps of:
    a) providing a transparent substrate having a first surface energy;
    b) providing a medium comprising a partition material on a carrier layer, said partition material having a second surface energy, said second surface energy being lower than said first surface energy;
    c) forming a matrix of cells on said substrate by directing radiation onto said partition material to selectively transfer imaged areas of said partition material onto said substrate and
    d) selectively depositing at least one colored fluid into at least one of said cells, said at least one colored fluid having a surface energy smaller than said first surface energy and larger than said second surface energy.

27. The method of claim 26 wherein said fluid comprises a colorant.

28. The method of claim 27 wherein said colorant is one of a pigment and a dye.

29. The method of claim 26 wherein said fluid comprises a solvent.

30. The method of claim 29 wherein said solvent comprises butyl carbitol acetate.

31. The method of claim 26 wherein directing radiation onto said partition material comprises directing laser radiation onto said partition material.

32. The method of claim 26 wherein said radiation comprises infrared radiation.

33. The method of claim 26 wherein directing radiation onto said partition material comprises directing laser radiation from a laser based imaging head onto said partition material.

34. The method of claim 26 wherein said transfer medium operates through laser induced film transfer.

35. The method of claim 26 wherein said transfer medium operates through a phase change transfer.

36. The method of claim 26 wherein said partition material is chemically stable in the presence of said fluid.

37. The method of claim 26 wherein said partition material is opaque.

38. The method of claim 26 wherein said partition material is transparent.

39. The method of claim 26, wherein said substrate is flexible.

40. An apparatus for fabricating a color filter matrix comprising:
  a) an imagewise controllable radiation source;
  b) a substrate mounting stage;
  c) a transfer media fixture for disposing imagewise transferable media between said controllable radiation source and a substrate mounted on said substrate mounting stage and,
  d) an inkjet printer head operative to deposit fluid onto said substrate.

41. An apparatus as in claim 40, further comprising
  a) a first translation stage disposed to generate relative motion between said radiation source and said substrate in the two planar dimensions of said substrate and
  b) a second translation stage disposed to generate relative motion between said inkjet printer head and said substrate in the two planar dimensions of said substrate.

42. The apparatus of claim 40, wherein said radiation source and said inkjet printer head share a common translation stage, said common translation stage being disposed to generate relative motion between said radiation source and said substrate in two planar dimensions of said substrate and said common translation stage being disposed to generate relative motion between said inkjet printer head and said substrate in two planar dimensions of said substrate.

43. The apparatus of claim 40 wherein said fluid comprises a colorant.

44. The apparatus of claim 43 wherein said colorant is one of a pigment and a dye.

45. The apparatus of claim 40 wherein said fluid comprises a solvent.

46. The apparatus of claim 45 wherein said solvent comprises butyl carbitol acetate.

47. The apparatus of claim 40 wherein said imagewise controllable radiation source is a laser.

48. The apparatus of claim 40 wherein said imagewise controllable radiation source is an infrared laser.

49. The apparatus of claim 40 wherein said imagewise controllable radiation source is a laser based imaging head.

50. The apparatus of claim 40 wherein said transfer media operate through laser induced film transfer.

51. The apparatus of claim 40 wherein said transfer media operate through a phase change transfer.

52. The apparatus of claim 40, wherein said substrate is flexible.

53. An apparatus for fabricating a low surface energy partition layer on a substrate comprising:
  a) An imagewise controllable radiation source disposed to emit radiation in response to control signals,
  b) a substrate mounting stage;
  c) a transfer media fixture to dispose a transfer medium between said controllable radiation source and said substrate, said medium comprising a layer of low surface energy partition material on a carrier layer, and
  d) translation stage to generate relative motion between said radiation source and said substrate in the two planar dimensions of said substrate.

54. An apparatus as in claim 53, comprising a fluid deposition unit disposed to deposit fluid on a substrate mounted on said substrate mounting stage.

55. An apparatus as in claim 54 wherein said fluid deposition unit comprises an inkjet head.

56. An apparatus as in claim 53, wherein said imagewise controllable radiation source comprises a laser.

57. A method for making an electronic device on a substrate, said method comprising the steps of
  a) providing a transfer medium, said transfer medium comprising:
    i) a carrier layer;
    ii) a low surface energy partition material layer;
  b) providing an imagewise controllable radiation source;
  c) transferring said partition material layer onto said substrate by imagewise exposing said transfer medium with said imagewise controllable radiation source and
  d) depositing an active material on those areas of said substrate bounded by said partition material.

58. A method as in claim 57, wherein said active material is a constituent material of an organic light emitting diode.

59. A method as in claim 57, wherein said active material is a constituent material of a semiconducting polymer device.

60. A method as in claim 57, wherein said depositing step is performed by inkjet.

61. A method as in claim 57, wherein said imagewise controllable radiation source comprises a laser.

62. A method as in claim 57, wherein said substrate is flexible.

63. A method for making an electronic device on a substrate, said method comprising the steps of
  a) providing a transfer medium, said transfer medium comprising:
    i) a carrier layer;
    ii) a low surface energy partition material layer
  b) providing an imagewise controllable radiation source;
  c) transferring said partition material onto said substrate by imagewise exposing said transfer medium with said imagewise controllable radiation source without changing the surface energy of said partition material after deposition and
  d) depositing a fluid on those areas of said substrate bounded by said partition material.

64. A method as in claim 63, wherein said fluid comprises a colorant.

65. A method as in claim 64, wherein said colorant is one of a pigment and a dye.

66. A method as in claim 63, wherein said fluid is an active material.

67. A method as in claim 66, wherein said active material is a constituent material of an organic light emitting diode.

68. A method as in claim 66, wherein said active material is a constituent material of a semiconducting polymer device.

69. A method as in claim 63, wherein said depositing step is performed by inkjet.

70. A method as in claim 63, wherein said imagewise controllable radiation source comprises a laser.

71. A method as in claim 63, wherein said substrate is flexible.

* * * * *